United States Patent [19]

Sato

[11] Patent Number: 4,679,173

[45] Date of Patent: Jul. 7, 1987

[54] SEQUENTIAL ACCESS LSI MEMORY CIRCUIT FOR PATTERN GENERATOR

[75] Inventor: Kazuyuki Sato, Tokyo, Japan

[73] Assignee: Kabushiki Kaisha Toshiba, Kawasaki, Japan

[21] Appl. No.: 710,687

[22] Filed: Mar. 12, 1985

[30] Foreign Application Priority Data

Mar. 13, 1984 [JP] Japan .................................. 59-47903

[51] Int. Cl.$^4$ .......................... G11C 7/00; G11C 8/00; G11C 11/40
[52] U.S. Cl. .................................. 365/233; 365/189; 365/230; 365/236
[58] Field of Search ............... 365/230, 236, 239, 240, 365/241, 189

[56] References Cited

U.S. PATENT DOCUMENTS 3,771,145  11/1973  Weiner ................................. 365/240
3,930,239  12/1975  Salters et al. ....................... 365/240
4,412,313  10/1983  Ackland et al. ..................... 365/240

OTHER PUBLICATIONS

IC Technical Data Toshiba MOS Memory Sixth Edition Mask ROM, pp. 252-255 DRAM, Sep. 1983.

Primary Examiner—Terrell W. Fears
Assistant Examiner—Melissa J. Koval
Attorney, Agent, or Firm—Finnegan, Henderson, Farabow, Garrett & Dunner

[57] ABSTRACT

In an LSI memory of the invention, in order to decrease the number of input address lines, an address counter having a bit length corresponding to some input address lines is incorporated in the LSI memory to compensate for the number of omitted input address lines. The address counter is counted up in response to a clock pulse supplied through an additional clock input signal line and is initialized in response to a chip enable signal.

2 Claims, 9 Drawing Figures

FIG. IA (PRIOR ART)
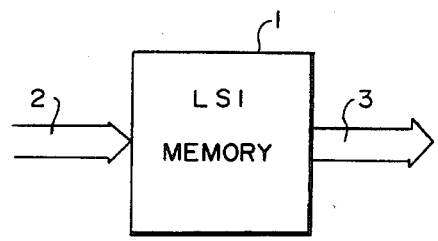
FIG. IB (PRIOR ART)
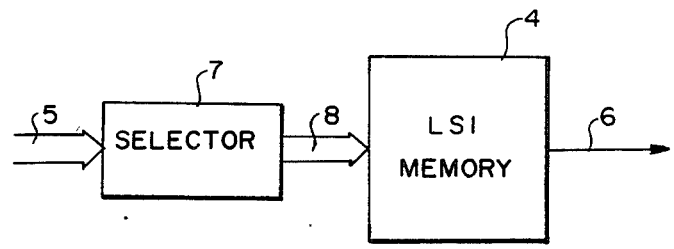
FIG. 2
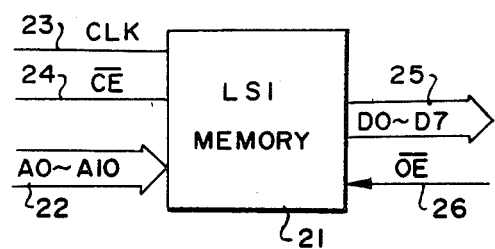

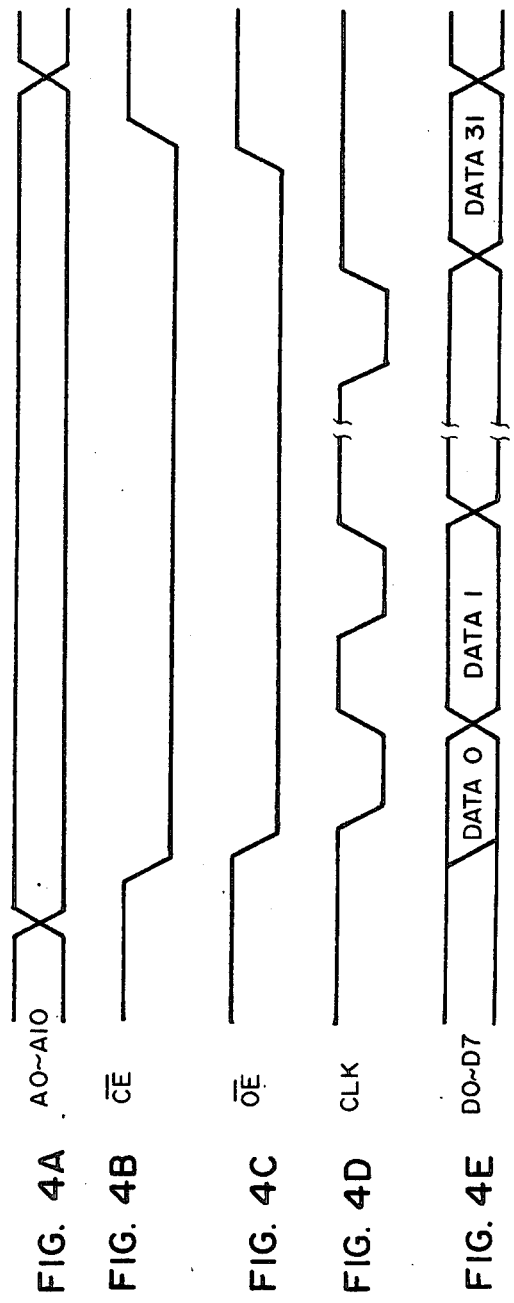

SEQUENTIAL ACCESS LSI MEMORY CIRCUIT FOR PATTERN GENERATOR

BACKGROUND OF THE INVENTION

The present invention relates to an LSI memory having a reduced number of address input lines.

The memory capacity of LSIs has greatly increased together with development of LSI techniques. The number of address lines for accessing a memory address and the package size for memory elements thereof have also increased. Static RAM and ROM are typical examples. FIG. 1A shows a conventional LSI memory of this type. For example, a 512k-bit static RAM 1 is connected to 16 address input lines 2 and an 8-bit data output bus 3.

A large number of memory chips are used to form an LSI memory. However, an address signal is supplied thereto in a time-division manner, thereby limiting the package size. A typical example is a dynamic RAM, as shown in FIG. 1B. A 64k-bit dynamic RAM 4 is connected to 16 address input lines 5, a 16-bit data output bus, a 16-out-of-8 selector (16 input lines and 8 output lines) 7 and eight address input lines 8. In this case, the address selector 7 must be arranged outside the LSI memory 4. This means that not much can be expected from an LSI memory having a small memory capacity. The overall hardware size and access time are thus increased, resulting in inconvenience.

SUMMARY OF THE INVENTION

It is an object of the present invention to provide an LSI memory, such as a character generator memory or a pattern memory, of a relatively large memory capacity, wherein the package for sealing the memory elements can be reduced in size even if the number of address lines in the memory element for reading data in units of blocks is increased.

In an LSI memory for reading data in units of 32-byte blocks and having a 5-bit internal counter, although 16 address lines must ordinarily be connected to this LSI memory, only 11 address lines and a counter clock line (a total of 12 lines) need be used. Since four address lines can be omitted, the package size can be decreased by a portion corresponding to the omitted four address lines.

In order to achieve the above object of the present invention, there is provided an LSI memory circuit comprising:

a memory matrix for generating the content of a location defined by a row address and a column address;

a row address decoder for supplying the row address to the memory matrix;

a column address decoder for receiving memory output data corresponding to the row address and for generating memory data in response to the column address supplied from a counter;

the counter performing counting in response to externally supplied clock pulses and supplying as the column address a count output to the column address decoder; and an output buffer for receiving an output from the column address decoder and for generating the memory data from the column address decoder in response to an externally supplied enable signal.

BRIEF DESCRIPTION OF THE DRAWINGS

Other objects and features of the present invention will be apparent from the following description taken in connection with the accompanying drawings, in which:

FIGS. 1A and 1B are representations respectively showing input and output lines of conventional LSI memories;

FIG. 2 is a representation showing input and output lines of an LSI memory according to an embodiment of the present invention;

FIGS. 4A through 4E are timing charts for explaining the operation of the LSI memory shown in FIG. 3.

DETAILED DESCRIPTION OF THE PREFERRED EMBODIMENT

Figure 3:
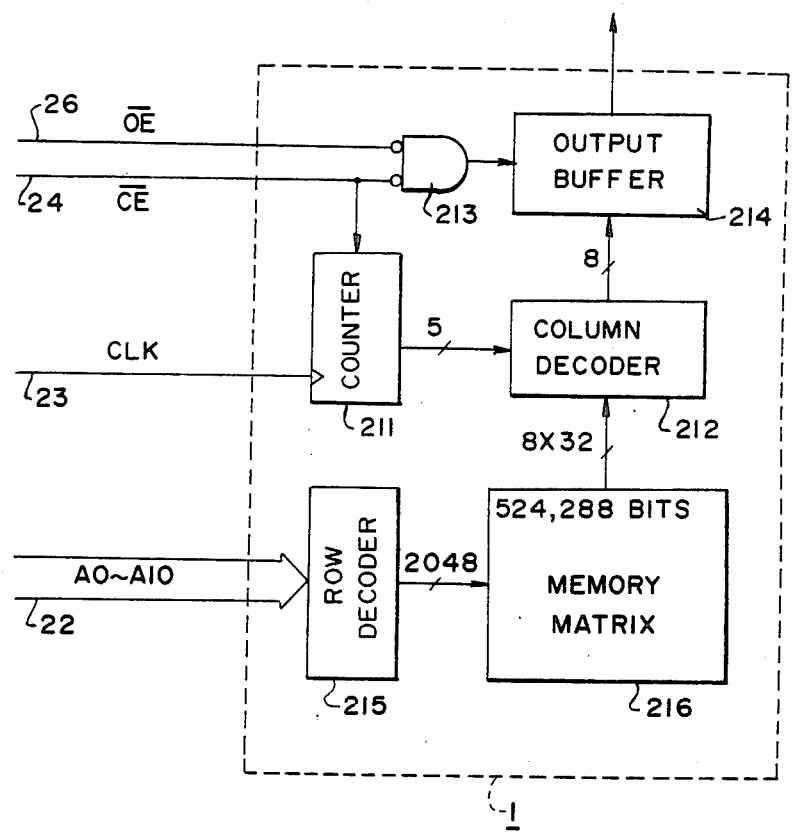
FIG. 3 is a detailed block diagram showing the internal arrangement of the LSI memory of FIG. 2.

Referring to FIG. 2, an LSI memory 21 has a capacity of 64k words×8 bits (=524,288 bits). The LSI memory 21 is connected to a 11-bit address input bus (i.e., address bits A0 through A10) 22 which can access 2k-word data, a clock line (CLK) 23 for supplying a clock pulse to an internal counter (to be described later), a signal line 24 for sending a chip enable signal $\overline{CE}$ so as to clear a count of the internal counter and enable an output buffer, an 8-bit data output bus (data bits D0 through D7) 25 and an output buffer enable signal line 26.

FIG. 3 is a block diagram showing an internal arrangement of the LSI memory 21 of FIG. 1. The same reference numerals for the signal lines and buses as in FIG. 2 denote the same parts in FIG. 3. A 5-bit counter 211 performs counting in response to clock pulses externally supplied through the clock line 23 and is cleared in response to the chip enable signal $\overline{CE}$ supplied through the signal line 24. The output from the counter 211 is supplied to a column decoder 212. The chip enable signal $\overline{CE}$ is supplied to one input terminal of a two-negated input AND gate 213. The other input terminal of the AND gate 213 receives an externally supplied output enable signal $\overline{OE}$. An output signal from the AND gate 213 is supplied as the enable signal to an output buffer 214. Address data transferred through the address input bus 22 is decoded by a row decoder 215, and the decoded data is supplied to a memory matrix 216. Memory data (8 bits×32 words in this embodiment) corresponding to a row line accessed by the row address data from the row decoder 215 is read out from the memory matrix 216 and supplied to the column decoder 212. Since the counter 211 supplies 5-bit column data to the column decoder 212, memory data (8 bits) accessed by the column address data from the column decoder 212 is generated outside the LSI memory 21 through the output buffer 214.

The operation of the LSI memory according to this embodiment of the present invention will be described with reference to FIGS. 4A through 4E. As shown in FIG. 4A, the address bits A0 through A10 are externally supplied to the LSI memory 21 through the address input bus 22. The chip enable signal $\overline{CE}$ (FIG. 4B) and the output enable signal $\overline{OE}$ (FIG. 4C) are enabled. The clock pulses shown in FIG. 4D are supplied to the counter 211. The counter 211 also receives the chip enable signal $\overline{CE}$ through the line 24 and supplies a 5-bit output "00000" as the initial value to the column decoder 212. As a result, a memory content accessed by the row address data supplied to the memory matrix 216 is read out from the memory matrix 216 and supplied to the column decoder 212. The column decoder 212 receives the column address data from the counter 211, so that the corresponding data (DATA0 shown in FIG. 4E) is read out. The count of the counter 211 is incremented by one in response to a clock pulse supplied through the line 23. In the same manner as described above, DATA1 shown in FIG. 4E is generated outside the LSI memory through the output buffer 214. Every time the clock pulse is supplied to the counter 211, the count is incremented. When the count of the counter 211 reaches "11111", DATA31 is read out in combination of the address bits A0 through A10 and the 5-bit counter output "11111".

As is apparent from the above description, when data is read out in units of 32-byte blocks, only the external clock is supplied to the LSI memory since it has the internal 5-bit counter. It should be noted that the bit length of the counter is increased when the block size is increased.

What is claimed is:

1. A sequential access LSI memory circuit for a pattern generator, comprising:
   a memory matrix for outputting, upon receipt of a row address, row data specified by said row address;
   a row address decoder for receiving and decoding an externally-supplied address and supplying the decoded address, as said row address, to said memory matrix;
   a counter for sequentially counting from a predetermined value in response to an externally-supplied clock signal, said counter being reset by an externally-supplied chip enable signal;
   a column address decoder, coupled to said memory matrix and said counter which supplies a count output corresponding to a column address to said column address decoder, for receiving memory output data from said memory matrix corresponding to the row address and for generating column data specified by said column address supplied from said counter; and
   an output buffer for receiving the column data from said column address decoder and for outputting the column data in response to an externally-supplied output signal.

2. The sequential access LSI memory circuit according to claim 1, further comprising means for receiving said externally-supplied chip enable signal and an externally-supplied output enable signal and for supplying said output signal to said output buffer when both said externally-supplied chip enable signal and output enable signal are active.

* * * * *